(12) United States Patent
Sun et al.

(10) Patent No.: US 11,380,865 B2
(45) Date of Patent: Jul. 5, 2022

(54) PACKAGE STRUCTURE, ELECTROLUMINESCENT DISPLAY SUBSTRATE, AND FABRICATION METHOD THEREOF

(71) Applicant: BOE TECHNOLOGY GROUP CO., LTD., Beijing (CN)

(72) Inventors: Zhongyuan Sun, Beijing (CN); Xiang Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 981 days.

(21) Appl. No.: 16/073,865

(22) PCT Filed: Jan. 11, 2018

(86) PCT No.: PCT/CN2018/072209
§ 371 (c)(1),
(2) Date: Jul. 30, 2018

(87) PCT Pub. No.: WO2018/205673
PCT Pub. Date: Nov. 15, 2018

(65) Prior Publication Data
US 2021/0210719 A1  Jul. 8, 2021

(30) Foreign Application Priority Data
May 11, 2017 (CN) .......................... 201710332885.9

(51) Int. Cl.
| | | |
|---|---|---|
| H01L 51/52 | (2006.01) | |
| H01L 51/56 | (2006.01) | |
| H01L 33/62 | (2010.01) | |

(52) U.S. Cl.
CPC ...... H01L 51/5253 (2013.01); H01L 51/5259 (2013.01); H01L 51/56 (2013.01); *H01L 33/62* (2013.01)

(58) Field of Classification Search
CPC . H01L 51/5253; H01L 59/5259; H01L 51/56; H01L 51/5256; H01L 51/5246; H01L 33/62
(Continued)

(56) References Cited

U.S. PATENT DOCUMENTS

| | | | |
|---|---|---|---|
| 2007/0194711 A1 | 8/2007 | Matsuura et al. | |
| 2016/0013444 A1* | 1/2016 | Cheng et al. | H01L 51/5256 257/40 |

(Continued)

FOREIGN PATENT DOCUMENTS

| | | | |
|---|---|---|---|
| CN | 101026228 A | 8/2007 | |
| CN | 101295768 A | 10/2008 | |

(Continued)

OTHER PUBLICATIONS

English translation of Chinese Patent CN105098090 A by Quan Jiajia Date Nov. 25, 2015 Assigned to Shenzhen China Star optoelectronics publication Year 2015.*

(Continued)

*Primary Examiner* — Thinh T Nguyen
(74) *Attorney, Agent, or Firm* — Calfee, Halter & Griswold LLP

(57) ABSTRACT

An electroluminescent display substrate and a fabrication method thereof, which relate to the field of display technology, and can effectively prevent moisture and oxygen from infiltrating into an electroluminescent device. The electroluminescent display substrate includes a first package layer and a second package layer stacked on a basal substrate. A planarization layer and a wall are sandwiched between the first package layer and the second package layer. The first package layer and the second package layer seal the wall and the planarization layer. An orthographic projection of the wall on the basal substrate surrounds an orthographic pro- (Continued)

jection of the planarization layer on the basal substrate, thereby restricting the planarization layer within an area enclosed by the wall.

14 Claims, 4 Drawing Sheets

(58) Field of Classification Search
USPC .......... 257/40, 100, 787; 438/82, 99, 22
See application file for complete search history.

(56) References Cited

U.S. PATENT DOCUMENTS

2016/0365538 A1  12/2016  Qian
2018/0102505 A1  4/2018  Qian

FOREIGN PATENT DOCUMENTS

| CN | 105098090 A | 11/2015 |
| CN | 105679969 A | 6/2016 |
| CN | 107425136 A | 12/2017 |
| JP | 2002008856 A | 1/2002 |
| JP | 2016001569 A | 1/2016 |
| JP | 2016122506 A | 7/2016 |
| JP | 2016143457 A | 8/2016 |
| WO | 2014185025 A1 | 11/2014 |
| WO | 2015190096 A1 | 12/2015 |

OTHER PUBLICATIONS

First Office Action for Chinese Patent Application No. 201710332885.9 dated Aug. 3, 2018.
Search Report and Written Opinion for International Application No. PCT/CN2018/072209 dated Apr. 16, 2018.

* cited by examiner

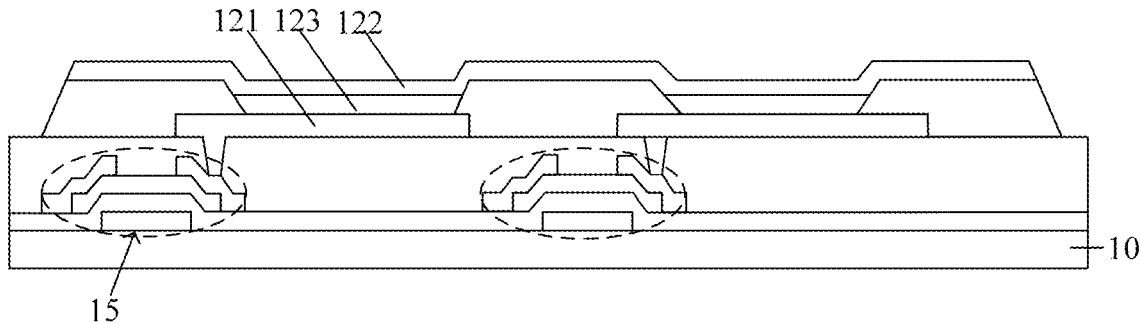

Fig. 6

| providing a basal substrate, the basal substrate including a display area and a non-display area surrounding the display area; and disposing an electroluminescent device within the display area on the basal substrate | —S10 |
|---|---|
| forming a first package layer on the basal substrate provided with the electroluminescent device | —S11 |
| forming a planarization layer and a wall on the first package layer; an orthographic projection of the wall on the basal substrate surrounding an orthographic projection of the planarization layer on the basal substrate, thereby restricting the planarization layer within an area enclosed by the wall | —S12 |
| forming a second package layer; the first package layer and the second package layer sealing the wall and the planarization layer. The orthographic projection of the wall on the basal substrate and the orthographic projection of the planarization layer on the basal substrate at least completely cover the display area | —S13 |

Fig. 7

PACKAGE STRUCTURE, ELECTROLUMINESCENT DISPLAY SUBSTRATE, AND FABRICATION METHOD THEREOF

RELATED APPLICATIONS

The present application is the U.S. national phase entry of the international application PCT/CN2018/072209, with an international filing date of Jan. 11, 2018, which claims the benefit of Chinese Patent Application No. 201710332885.9, filed on May 11, 2017, the entire disclosure of which is incorporated herein by reference.

TECHNICAL FIELD

The present disclosure relates to the field of display technology, in particular to an electroluminescent display substrate and a fabrication method thereof.

BACKGROUND

Compared with liquid crystal display (LCD), organic light-emitting diode (OLED) display has advantages of thinness, lightness, wide viewing angle, self-illumination, continuous adjustable color, fast response, low energy consumption, low driving voltage, high luminous efficiency, flexible display, etc., which has attracted great attention from industry and the scientific community.

The electroluminescent display substrate includes a basal substrate, an electroluminescent device disposed on the basal substrate, and a package structure. The electroluminescent device includes an anode, a cathode, and an organic material functional layer between the anode and the cathode. Due to the extremely poor resistance to moisture and oxygen, it is easy for the organic material functional layer and the cathode to react with the infiltrated moisture, resulting in a rapid deterioration of the performance of the electroluminescent device. Therefore, it is necessary to provide a package structure to isolate the electroluminescent device from the environment, in order to prevent moisture and oxygen from infiltrating into the device.

SUMMARY

Embodiments of the present disclosure provide an electroluminescent display substrate and a fabrication method thereof, which can effectively prevent moisture and oxygen from infiltrating into an electroluminescent device.

According to an exemplary embodiment of the present disclosure, a package structure is provided. The package structure includes a first package layer and a second package layer stacked on a basal substrate; a planarization layer and a wall are sandwiched between the first package layer and the second package layer; where the first package layer and the second package layer seal the wall and the planarization layer; and an orthographic projection of the wall on the basal substrate surrounds an orthographic projection of the planarization layer on the basal substrate, restricting the planarization layer within an area enclosed by the wall.

In certain exemplary embodiments, a material of the wall includes a desiccant.

In certain exemplary embodiments, the material of the wall further includes a curable glue having a water content less than 200 ppm; the desiccant is mixed into the curable glue, and the weight percentage of the desiccant in the wall is 0.1%~1%.

In certain exemplary embodiments, materials of the first package layer and the second package layer are selected from at least one of $SiN_x$, SiON, and $Al_2O_3$; and the planarization layer includes a resin material.

According to another exemplary embodiment of the present disclosure, an electroluminescent display substrate is provided. The electroluminescent display substrate includes a basal substrate including a display area and a non-display area surrounding the display area; an electroluminescent device disposed on the basal substrate and located in the display area; and a package structure. The package structure includes a first package layer and a second package layer stacked on the basal substrate; a planarization layer and a wall sandwiched between the first package layer and the second package layer; where the first package layer and the second package layer seal the wall and the planarization layer; and an orthographic projection of the wall on the basal substrate surrounds an orthographic projection of the planarization layer on the basal substrate, thereby restricting the planarization layer within an area enclosed by the wall. Moreover, the orthographic projection of the wall on the basal substrate and the orthographic projection of the planarization layer on the basal substrate at least completely cover the display area.

In certain exemplary embodiments, the orthographic projection of the planarization layer on the basal substrate at least completely covers the display area.

In certain exemplary embodiments, a distance between the orthographic projection of the wall on the basal substrate and the display area is 500~2500 μm.

In certain exemplary embodiments, the orthographic projection of the wall on the basal substrate covers a boundary between the display area and the non-display area.

In certain exemplary embodiments, a material of the wall includes a desiccant.

In certain exemplary embodiments, the material of the wall further includes a curable glue having a water content less than 200 ppm; the desiccant is mixed into the curable glue, and the weight percentage of the desiccant in the wall is 0.1%~1%.

In certain exemplary embodiments, the wall has a width of 300~500 μm.

In certain exemplary embodiments, materials of the first package layer and the second package layer are selected from at least one of $SiN_x$, SiON, and $Al_2O_3$; and the planarization layer includes a resin material.

In certain exemplary embodiments, the basal substrate is a flexible basal substrate.

According to yet another exemplary embodiment of the present disclosure, a display apparatus is provided. The display apparatus includes the electroluminescent display substrate as described in any one of the above embodiments.

According to still another exemplary embodiment of the present disclosure, a fabrication method of an electroluminescent display substrate is provided. The method includes providing a basal substrate, where the basal substrate includes a display area and a non-display area surrounding the display area; disposing an electroluminescent device within the display area on the basal substrate; forming a first package layer on the basal substrate provided with the electroluminescent device; forming a planarization layer and a wall on the first package layer, an orthographic projection of the wall on the basal substrate surrounding an orthographic projection of the planarization layer on the basal substrate, thereby restricting the planarization layer within an area enclosed by the wall; and forming a second package layer, the first package layer and the second package layer sealing the wall and the planarization layer. The orthographic projection of the wall on the basal substrate and the orthographic projection of the planarization layer on the basal substrate at least completely cover the display area.

In certain exemplary embodiments, the orthographic projection of the planarization layer on the basal substrate at least completely covers the display area.

In certain exemplary embodiments, the orthographic projection of the wall on the basal substrate covers a boundary between the display area and the non-display area.

In certain exemplary embodiments, a material of the wall includes a desiccant.

In certain exemplary embodiments, forming a planarization layer and a wall on the first package layer includes forming the wall by a printing or gluing process on the first package layer, and curing the wall; and forming the planarization layer by a printing or gluing process on the first package layer, the planarization layer being restricted within an area enclosed by the wall, and curing the planarization layer.

In certain exemplary embodiments, the first package layer and the second package layer are formed by chemical vapor deposition respectively.

BRIEF DESCRIPTION OF THE DRAWINGS

In order to more clearly illustrate the technical solutions in embodiments of the disclosure or in the prior art, the appended drawings needed to be used in the description of the embodiments or the prior art will be introduced briefly in the following. Obviously, the drawings in the following description are only some embodiments of the disclosure, and for those of ordinary skill in the art, other drawings can be obtained according to these drawings under the premise of not paying out creative work.

FIG. 2 is a cross section view of the electroluminescent display substrate along the A-A' line in FIG. 1a;

FIG. 6 is a schematic diagram of disposing a thin film transistor in a display area according to an embodiment of the present disclosure; and FIG. 7 is a flow chart of fabricating an electroluminescent display substrate according to an embodiment of the present disclosure.

DETAILED DESCRIPTION OF THE DISCLOSURE

Figure 1A:
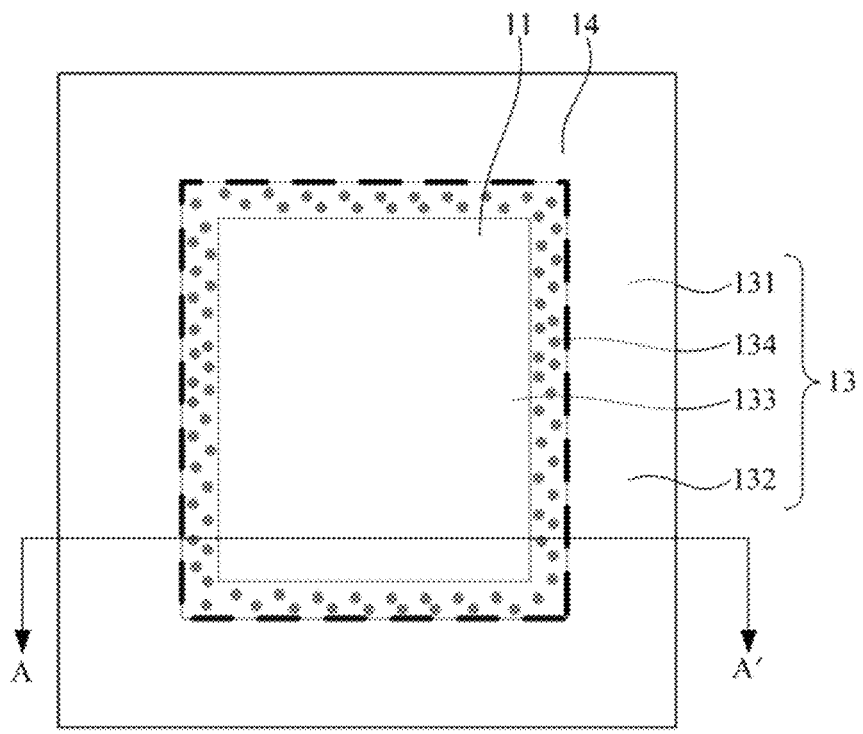
FIG. 1a is a schematic top view of an electroluminescent display substrate according to an embodiment of the present disclosure.

In the following, the technical solutions in the embodiments of the disclosure will be described clearly and completely in connection with the drawings in the embodiments of the disclosure. The embodiments of the disclosure are not limited to the exemplary embodiments described herein. Even if not explicitly described, any combination of the options can be made unless specifically excluded, and include all other embodiments obtained by those of ordinary skill in the art within the scope of the disclosure.

According to an exemplary embodiment of the present disclosure, a package structure is provided. As shown in FIG. 1a-5, the package structure includes: a first package layer 131 and a second package layer 132 stacked on a basal substrate 10; a planarization layer 133 and a wall 134 are sandwiched between the first package layer 131 and the second package layer 132; the first package layer 131 and the second package layer 132 seal the wall 134 and the planarization layer 133; and an orthographic projection of the wall 134 on the basal substrate 10 surrounds an orthographic projection of the planarization layer 133 on the basal substrate 10, thereby restricting the planarization layer 133 within an area enclosed by the wall 134.

In certain exemplary embodiments, the material of the wall 134 includes a desiccant.

Due to the desiccant in the wall, moisture and oxygen infiltrate from the edge of the display substrate will be first blocked by the wall containing the desiccant, and the desiccant can absorb moisture and oxygen, thereby preventing moisture and oxygen from infiltrating into the electroluminescent device from the edge of the display substrate.

In certain exemplary embodiments, the material of the wall further includes a curable glue having a water content less than 200 ppm; the desiccant is mixed into the curable glue, and the weight percentage of the desiccant in the wall ranges from 0.1% to about 1%.

In certain exemplary embodiments, materials of the first package layer and the second package layer are selected from at least one of $SiN_x$, SiON, and $Al_2O_3$; and the planarization layer includes a resin material.

According to another exemplary embodiment of the present disclosure, an electroluminescent display substrate is provided. As shown in FIGS. 1a-5, the electroluminescent display substrate includes: a basal substrate 10 including a display area 11 (as shown by the dashed boxes in FIG. 1a, FIG. 1b, FIG. 3 and FIG. 5) and a non-display area 14 surrounding the display area 11, an electroluminescent device 12 disposed on the basal substrate 10 and located in the display area 11, and a package structure 13. The package structure 13 includes a first package layer 131 and a second package layer 132 stacked on the basal substrate 10; a planarization layer 133 and a wall 134 are sandwiched between the first package layer 131 and the second package layer 132; the first package layer 131 and the second package layer 132 seal the wall 134 and the planarization layer 133; and an orthographic projection of the wall 134 on the basal substrate 10 surrounds an orthographic projection of the planarization layer 133 on the basal substrate 10, thereby restricting the planarization layer 133 within an area enclosed by the wall 134. Moreover, the orthographic projection of the wall 134 on the basal substrate 10 and the orthographic projection of the planarization layer on the basal substrate 10 at least completely cover the display area.

In some embodiments of the present disclosure, the orthographic projections of the wall 134 and the planarization layer 133 on the basal substrate 10 are located in the orthographic projections of the first package layer 131 and the second package layer 132 on the basal substrate 10. In the context of the present disclosure, "the first package layer and the second package layer seal the wall and the planarization layer" means that the first package layer and the second package layer are in contact with each other at least at the edge positions, thereby sealing the wall and the planarization layer.

Figure 3:
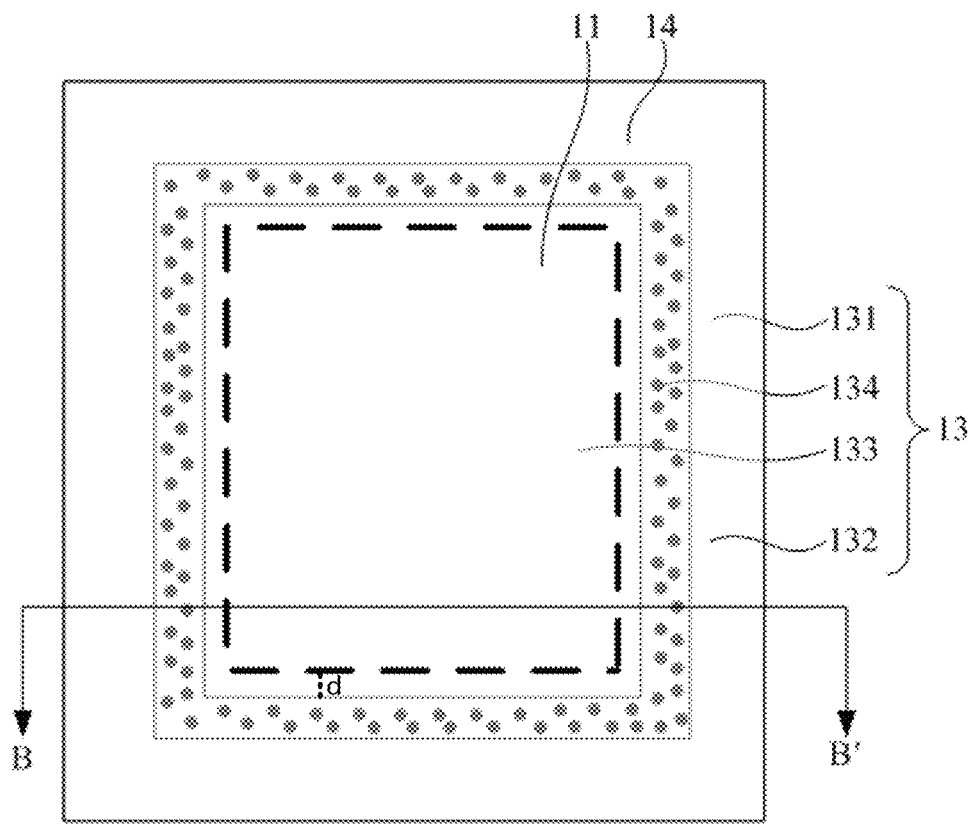
FIG. 3 is a schematic top view of an electroluminescent display substrate according to yet another embodiment of the present disclosure.

In certain exemplary embodiments, as shown in FIG. 3, the orthographic projection of the planarization layer 133 on the basal substrate 10 at least completely covers the display area 11.

In certain exemplary embodiments, as shown in FIG. 3, a distance d between the orthographic projection of the wall 134 on the basal substrate 10 and the display area 11 ranges from 500 to about 2500 μm.

Figure 1B:
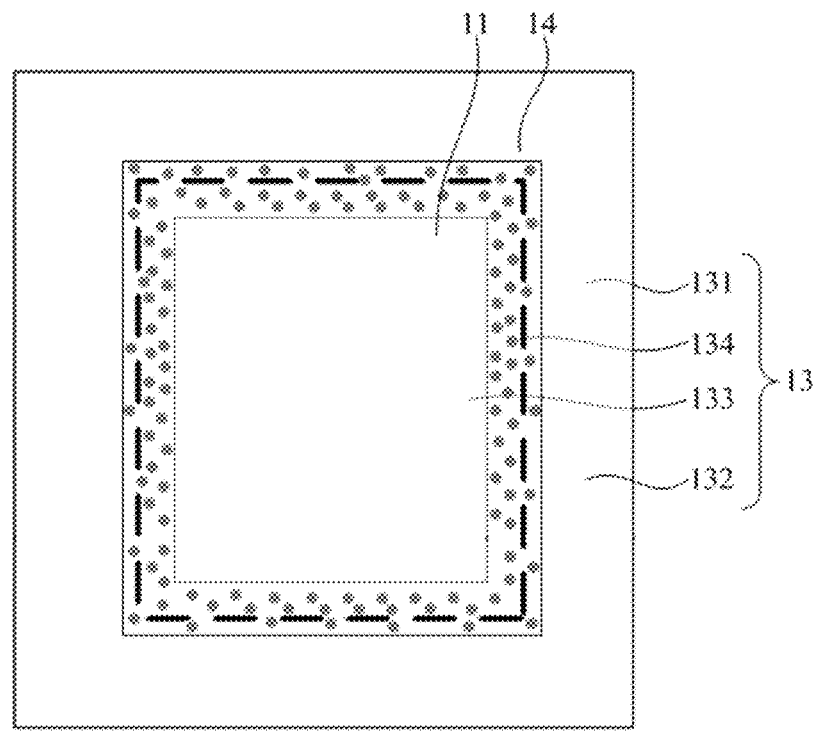
FIG. 1b is a schematic top view of an electroluminescent display substrate according to another embodiment of the present disclosure.

In certain exemplary embodiments, as shown in FIG. 1b, the orthographic projection of the wall 134 on the basal substrate 10 covers a boundary between the display area 11 and the non-display area 14 (as shown by the dotted line in FIG. 1b).

Figure 2:
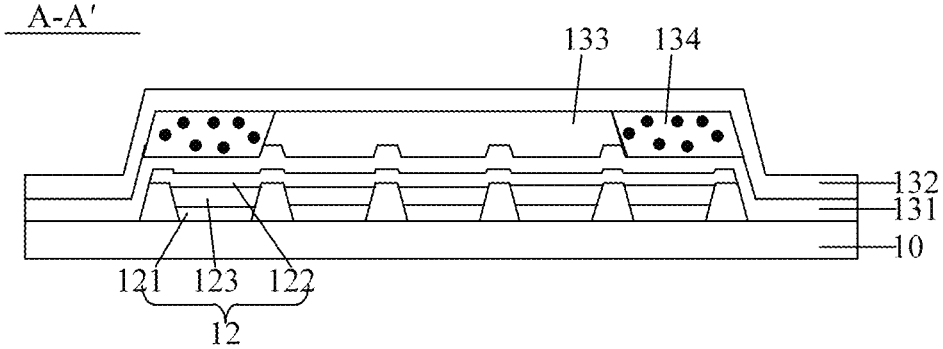
Figure 4:
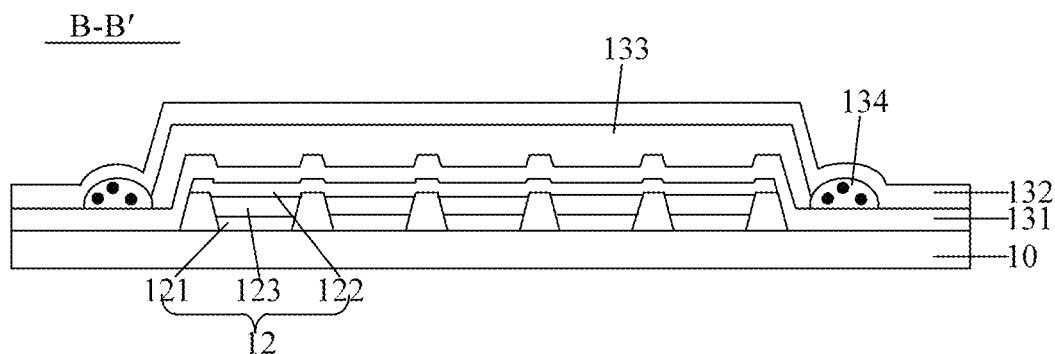
FIG. 4 is a cross section view of the electroluminescent display substrate along the B-B' line in FIG. 3.

As shown in FIG. 2 and FIG. 4, the electroluminescent device 12 includes an anode 121, a cathode 122, and an organic material functional layer 123 between the anode 121 and the cathode 122. The organic material functional layer 123 includes at least a light emitting layer, and further includes an electron transport layer and a hole transport layer. In order to improve the efficiency of electron and hole injection into the light emitting layer, the organic material functional layer 123 can further include an electron injection layer between the cathode 122 and electron transport layer, and a hole injection layer between the anode 121 and the hole transport layer.

Depending on the materials of the anode 121 and the cathode 122, electroluminescent devices can be classified into a single-sided emitting type and a double-sided emitting type. That is, when the material of one of the anode 121 and the cathode 122 is an opaque material, the electroluminescent device 12 is a single-sided emitting type electroluminescent device; when the materials of the anode 121 and the cathode 122 are both transparent materials, the electroluminescent device 12 is a double-sided emitting type electroluminescent device.

For the single-sided emitting type electroluminescent device 12, it can be further classified into a top-emitting type and a bottom-emitting type depending on the materials of the anode 121 and the cathode 122. Specifically, for an embodiment in which the anode 121 is disposed close to the basal substrate 10 and the cathode 122 is disposed away from the basal substrate 10, when the material of the anode 121 is transparent, and the material of the cathode 122 is opaque, light is emitted from the anode 121 and then exits through the side of basal substrate 10, then the electroluminescent device can be referred to as a bottom-emitting type;

when the material of the anode 121 is opaque and the material of the cathode 122 is transparent, light is emitted from the side of the cathode 122, then the electroluminescent device can be referred to as a top-emitting type. Of course, the relative positions of the anode 121 and the cathode 122 can also be interchanged, and details are not described herein again.

For the double-sided emitting type electroluminescent device 12, in an embodiment, the anode 121 is disposed close to the basal substrate 10, and the cathode 122 is disposed away from the basal substrate 10, the materials of the anode 121 and the cathode 122 are transparent. On one hand, light is emitted from the anode 121 and then exits through the side of the basal substrate 10, on the other hand, light is also emitted from the side of the cathode 404, so the electroluminescent device can be referred to as a double-sided emitting type.

It should be noted that, the first package layer 131 and the second package layer 132 seal the wall 134 and the planarization layer 133, that is, the first package layer 131 and the second package layer 132 extend beyond the area of the planarization layer 133 and the wall 134, and in the area beyond the planarization layer 133 and the wall 134, the first package layer 131 and the second package layer 132 are in contact with each other.

In certain exemplary embodiments, the first package layer 131 and the second package layer 132 cover the basal substrate 10, which simplifies the process of forming the first package layer 131 and the second package layer 132.

For the planarization layer 133, its main function is to planarize the display area 11 to improve the display effect. Based on this, the material of the planarization layer 133 should be selected from organic materials having fluidity in a molten or liquid state.

Since the planarization layer 133 is located in the display area 11, the planarization layer 133 should be transparent.

Since the planarization layer 133 is required to have fluidity before cured to level the material of the planarization layer, for the wall 134, the primary function of the wall 134 is to prevent the fluid material of the planarization layer from crossing the wall 134 during the process of forming the planarization layer 133, thereby restricting the material of the planarization layer within the area enclosed by the wall 134.

In certain exemplary embodiments, the material of the wall 134 includes a desiccant (as shown by the dots in FIGS. 1a-5).

In certain exemplary embodiments, the material of the wall further includes a curable glue having a water content less than 200 ppm; the desiccant is mixed into the curable glue, and the weight percentage of the desiccant in the wall ranges from 0.1% to about 1%.

Since the wall 134 includes a desiccant, the wall 134 also has the function of absorbing moisture and oxygen in the environment. The desiccant is mixed into the basic material of the wall 134. The basic material of the wall 134 is not limited herein, as long as the structure of the wall 134 can be formed and the content of moisture and oxygen is low.

The desiccant can be a particle desiccant or a powder desiccant.

The basic material of the wall 134 can be the same as or different from the material of the planarization layer. Considering that the wall 134 may be disposed in the display area 11, when the basic material of the wall 134 and the material of the planarization layer are selected, these two materials may have high wettability for each other.

The wall 134 and the planarization layer 133 can cover at least the display area 11, that is, the entirety of the wall 134 and the planarization layer 133 cover at least the display area 11. Since the wall 134 can be used to prevent the fluid material of the planarization layer from crossing the wall 134 during the process of forming a planarization layer 133, the edge of the wall 134 adjacent to the planarization layer 133 is in contact with the edge of the planarization layer 133 adjacent to the wall 134.

In the case where the wall 134 is located in the display area 11, its width, height, material, and the like should be determined to ensure the display effect of the area in which the wall 134 is located.

In the electroluminescent display substrate provided by embodiments of the present disclosure, the package structure is configured to include a first package layer, a second package layer, and a planarization layer and a wall sandwiched between the first package layer and the second package layer. In an exemplary embodiment, by sealing the wall and the planarization layer by the first package layer and the second package layer, moisture and oxygen can be prevented from infiltrating into the display substrate from the interface of the wall and the second package layer. In another exemplary embodiment, due to the desiccant in the wall, moisture and oxygen infiltrate from the edge of the display substrate will be first blocked by the wall containing the desiccant, and the desiccant can absorb moisture and oxygen, thereby preventing moisture and oxygen from infiltrating into the electroluminescent device from the edge of the display substrate. In still another exemplary embodiment, the planarization layer can be restricted in the area enclosed by the wall, thereby ensuring the flatness of the area and improving the display effect.

In certain exemplary embodiments, a width of the wall 134 ranges from 300 to about 500 µm.

When moisture and oxygen infiltrate from the edge of the display substrate, moisture and oxygen need to pass through the width path of the wall 134 to enter the electroluminescent display substrate. The width of the wall 134 is set to range from 300 to about 500 µm, so that the wall 134 can block moisture and oxygen effectively.

In certain exemplary embodiments, a height of the wall 134 can be designed to range from 8 to about 16 µm, and a height of the planarization layer 133 can be designed to range from 2 to about 16 µm.

In certain exemplary embodiments, materials of the first package layer 131 and the second package layer 132 are selected from at least one of silicon nitride ($SiN_x$), silicon oxynitride (SiON), and aluminum oxide ($Al_2O_3$). On the one hand, these materials have high compactness and can block moisture and oxygen effectively; on the other hand, these materials are cheap and will not cause a substantial increase in the cost of the electroluminescent display substrate.

In certain exemplary embodiments, the planarization layer 133 includes a resin material. The resin material can be an epoxy resin, an acrylic resin or the like. The planarization layer 133 can be made of a resin material since the resin material has high fluidity in a liquid state, and a wide range of resin materials can be selected.

The material of the planarization layer 133 can be an organic transparent material having fluidity in a molten or liquid state. The wettability between the curable glue and the organic transparent material may be high enough so that there is no obvious interface between the curable glue and the organic transparent material. Therefore, when the wall 134 is disposed in the display area 11, the display effect can be ensured. In addition, the adhesion of the curable glue to the first package layer 131 and the second package layer 132 is strong, thus moisture and oxygen can be prevented from either infiltrating from the interface between first package layer 131 and the wall 134 or infiltrating from the interface between the second package layer 132 and the wall 134.

Further, the desiccant can have a diameter ranging from 1 to about 8 µm.

In certain exemplary embodiments, the first package layer and the second package layer are both made of a compact inorganic material.

Based on the above, in certain exemplary embodiments, as shown in FIG. 1a and FIG. 1b, the wall 134 is disposed at the edge of the display area 11, and the wall 134 is transparent. In this case, the wall 134 and the planarization layer 133 cover only the display area 11, and the wall 134 is located at the edge of the display area 11.

In order to ensure the display effect at the edge of the electroluminescent display substrate, the heights of the wall 134 and the planarization layer 133 can be equal to reduce the optical difference at the edge of the display area 11.

The wall 134 is transparent, that is, the basic material constituting the wall 134 and the desiccant are both transparent. In this case, the desiccant can be a transparent silica-gel desiccant.

By disposing the wall 134 at the edge of the display area 11, the width of the frame can be narrowed without affecting the display area 11, which is advantageous for achieving a narrow frame design of the product.

In certain exemplary embodiments, as shown in FIG. 3, the wall 134 is disposed in the non-display area 14; the planarization layer 133 covers the display area 11 and extends to the non-display area 14. In this case, the desiccant in the wall 134 can be a transparent material or an opaque material. The desiccant can be selected from calcium oxide, barium oxide, etc.

In the embodiment of the present disclosure, the planarization layer 133 extends to the non-display area 14. Even if a small amount of moisture and oxygen passes through the wall 134, due to the existence of a portion of the planarization layer 133 between the wall 134 and the display area 11, moisture and oxygen can still be blocked and prevented from infiltrating into the electroluminescent device 12.

Figure 5:
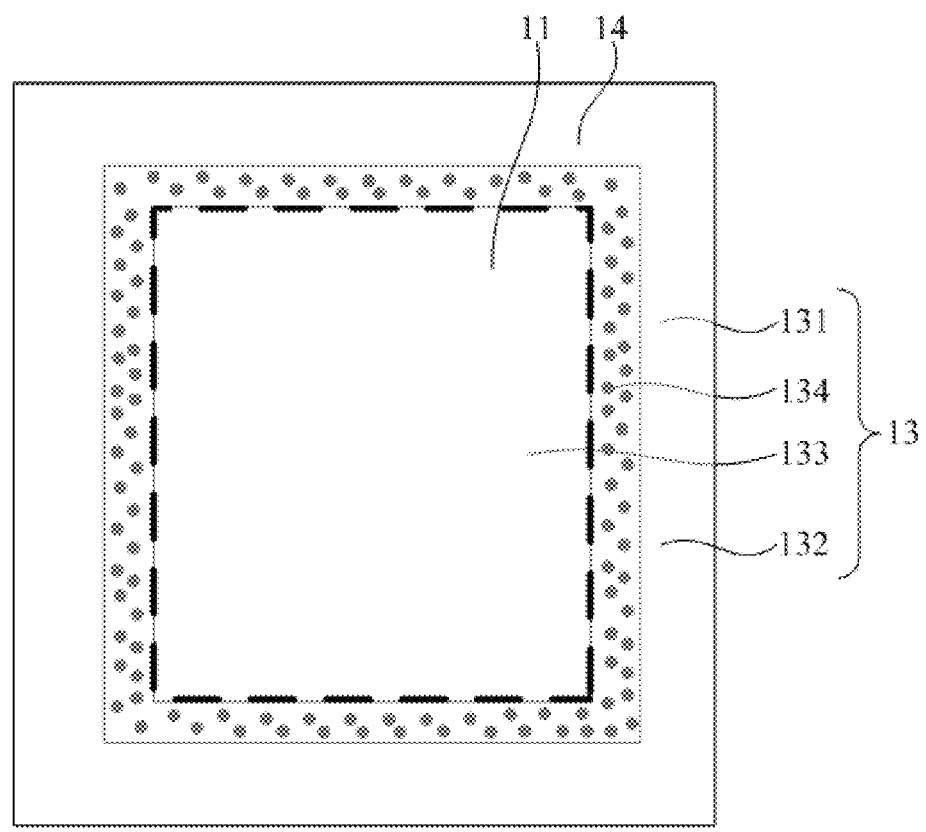
FIG. 5 is a schematic top view of an electroluminescent display substrate according to still another embodiment of the present disclosure.

In certain exemplary embodiments, as shown in FIG. 5, the orthographic projection of the planarization layer 133 on the basal substrate 10 overlaps with the display area 11.

On the basis of the above, as shown in FIG. 6, in certain exemplary embodiments, the electroluminescent display substrate further includes a thin film transistor 15 sandwiched between the basal substrate 10 and the electroluminescent device 12 in the display area 11. A drain of the thin film transistor 15 can be electrically connected to an anode 121 of the electroluminescent device.

The thin film transistor 15 includes a gate, a gate insulating layer, a semiconductor active layer, a source and a drain; and the thin film transistor 15 can be an amorphous silicon thin film transistor, a low temperature polysilicon thin film transistor, an oxide semiconductor thin film transistor, an organic thin film transistor, etc.

When the electroluminescent display substrate includes a thin film transistor 15, the light emission of the electroluminescent device 12 can be controlled by the thin film transistor 15, so that the electroluminescent display substrate has the characteristics of fast reaction speed, high contrast, and wide viewing angle.

In certain exemplary embodiments, the basal substrate 10 is a flexible basal substrate. In this way, the electroluminescent display substrate can be bent to meet different market demands.

The material of the flexible basal substrate can be selected from at least one of polyimide, polycarbonate, polyacrylate, and polyetherimide.

It should be noted that the electroluminescent display substrate of the present disclosure can further include a rigid basal substrate or a flexible protective film (or the like) disposed on the package structure.

An embodiment of the present disclosure further provides a fabrication method of an electroluminescent display substrate. As shown in FIG. 7, the method includes the following steps.

S10 is the step of providing a basal substrate, where the basal substrate includes a display area and a non-display area surrounding the display area; and disposing an electroluminescent device within the display area on the basal substrate.

The basal substrate can be a flexible basal substrate or a rigid basal substrate.

S11 is the step of forming a first package layer on the basal substrate provided with the electroluminescent device.

Specifically, the first package layer can be formed by chemical vapor deposition. A material of the first package layer is selected from at least one of $SiN_x$, SiON, and $Al_2O_3$.

S12 is the step of forming a planarization layer and a wall on the first package layer; having an orthographic projection of the wall on the basal substrate surrounding an orthographic projection of the planarization layer on the basal substrate, thereby restricting the planarization layer within an area enclosed by the wall.

In certain exemplary embodiments, the step of forming a planarization layer and a wall on the first package layer includes forming the wall by a printing or gluing process on the first package layer, and curing the wall; and forming the planarization layer by a printing or gluing process on the first package layer, the planarization layer being restricted within an area enclosed by the wall, and curing the planarization layer.

The planarization layer includes a resin material. The resin material can be an epoxy resin, an acrylic resin or the like.

In certain exemplary embodiments, a material of the wall includes a desiccant (as indicated by the dots in FIGS. 1a-5).

The desiccant is mixed into the material of the wall, and the basic material of the wall can be the same to or different from the material of the planarization layer. Considering that the wall 134 may be disposed in the display area 11, for selecting the basic material of the wall 134 and the material of the planarization layer, the wettability between these two materials should be high. In addition, for the basic material of the wall, the content of moisture and oxygen should be low. For example, the content of moisture and oxygen is less than 200 ppm.

The desiccant can have a diameter ranging from 1 to about 8 μm.

S13, forming a second package layer; the first package layer and the second package layer sealing the wall and the planarization layer. The orthographic projection of the wall on the basal substrate and the orthographic projection of the planarization layer on the basal substrate at least completely cover the display area.

In certain exemplary embodiments, the first package layer and the second package layer are both made of a compact inorganic material.

In certain exemplary embodiments, the first package layer and the second package layer are formed by chemical vapor deposition respectively. Specifically, the second package layer can be formed by chemical vapor deposition. A material of the second package layer is selected from at least one of $SiN_x$, SiON, and $Al_2O_3$.

In the fabrication method of an electroluminescent display substrate provided by the embodiment of the present disclosure, the package structure is configured to include a first package layer, a second package layer, and a planarization layer and a wall sandwiched between the first package layer and the second package layer. In an exemplary embodiment, by sealing the wall and the planarization layer by the first package layer and the second package layer, moisture and oxygen can be prevented from infiltrating into the display substrate from the interface of the wall and the second package layer. In another exemplary embodiment, due to the desiccant in the wall, moisture and oxygen infiltrate from the edge of the display substrate will be first blocked by the wall containing the desiccant, and the desiccant can absorb moisture and oxygen, thereby preventing moisture and oxygen from infiltrating into the electroluminescent device from the edge of the display substrate. In still another exemplary embodiment, the planarization layer can be restricted in the area enclosed by the wall, thereby ensuring the flatness of the area and improving the display effect.

In certain exemplary embodiments, in the fabrication method of the electroluminescent display substrate provided by the embodiment of the present disclosure, as shown in FIG. 3, the orthographic projection of the planarization layer 133 on the basal substrate 10 at least completely covers the display area 11.

In certain exemplary embodiments, in the fabrication method of the electroluminescent display substrate provided by the embodiment of the present disclosure, as shown in FIG. 1b, the orthographic projection of the wall 134 on the basal substrate 10 covers a boundary between the display area 11 and the non-display area 14 (as shown by the dashed lines in FIG. 1b).

On the basis of the above, as shown in FIG. 6, in certain exemplary embodiments, the fabrication method further includes forming a thin film transistor 15 between the basal substrate 10 and the electroluminescent device 12 in the display area 11. A drain of the thin film transistor 15 can be electrically connected to an anode 121 of the electroluminescent device.

When the electroluminescent display substrate includes a thin film transistor 15, the light emission of the electroluminescent device 12 can be controlled by the thin film transistor 15, so that the electroluminescent display substrate has the characteristics of fast reaction speed, high contrast, and wide viewing angle.

In certain exemplary embodiments, the basal substrate 10 is a flexible basal substrate. In this way, the electroluminescent display substrate can be bent to meet different market demands.

According to the embodiments of the present disclosure, a package structure, an electroluminescent display substrate and a fabrication method thereof are provided, the package structure includes a first package layer, a second package layer, a planarization layer and a wall sandwiched between the first package layer and the second package layer. In an exemplary embodiment, by sealing the wall and the planarization layer with the first package layer and the second package layer, moisture and oxygen can be prevented from infiltrating into the display substrate from the interface of the wall and the second package layer. In another exemplary embodiment, due to the desiccant in the wall, moisture and oxygen infiltrate from the edge of the display substrate will be first blocked by the wall containing the desiccant, and the desiccant can absorb moisture and oxygen, thereby preventing moisture and oxygen from infiltrating into the electroluminescent device from the edge of the display substrate. Moreover, the planarization layer can be restricted in the area enclosed by the wall, thereby ensuring the flatness of the area and improving the display effect.

The above embodiments are only used for explanations rather than limitations to the present disclosure, the ordinary skilled person in the related technical field, in the case of not departing from the spirit and scope of the present disclosure, may also make various modifications and variations, therefore, all the equivalent solutions also belong to the scope of the present disclosure, the patent protection scope of the present disclosure should be defined by the claims.

What is claimed is:

1. A package structure, comprising:
    a first package layer and a second package layer stacked on a basal substrate;

wherein a planarization layer and a wall are sandwiched between the first package layer and the second package layer; the first package layer and the second package layer seal the wall and the planarization layer; an orthographic projection of the wall on the basal substrate surrounds an orthographic projection of the planarization layer on the basal substrate, the planarization layer is restricted within an area enclosed by the wall.

2. The package structure according to claim 1, wherein a material of the wall comprises a desiccant.

3. The package structure according to claim 2, wherein the material of the wall further comprises a curable glue having a water content less than 200 ppm; the desiccant is mixed into the curable glue, and a weight percentage of the desiccant in the wall is 0.1%~1%.

4. The package structure according to claim 1, wherein materials of the first package layer and the second package layer are selected from at least one of $SiN_X$, SiON, and $Al_2O_3$; and the planarization layer comprises a resin material.

5. An electroluminescent display substrate, comprising:
a basal substrate comprising a display area and a non-display area surrounding the display area;
an electroluminescent device disposed on the basal substrate and located in the display area; and
a package structure;
wherein the package structure comprises a first package layer and a second package layer stacked on the basal substrate;
a planarization layer and a wall are sandwiched between the first package layer and the second package layer;
the first package layer and the second package layer seal the wall and the planarization layer; and
an orthographic projection of the wall on the basal substrate surrounds an orthographic projection of the planarization layer on the basal substrate, and the planarization layer is restricted within an area enclosed by the wall;
and wherein the orthographic projection of the wall on the basal substrate and the orthographic projection of the planarization layer on the basal substrate at least completely cover the display area.

6. The electroluminescent display substrate according to claim 5, wherein the orthographic projection of the planarization layer on the basal substrate at least completely covers the display area.

7. The electroluminescent display substrate according to claim 6, wherein a distance between the orthographic projection of the wall on the basal substrate and the display area is 500~2500 μm.

8. The electroluminescent display substrate according to claim 5, wherein the orthographic projection of the wall on the basal substrate covers a boundary between the display area and the non-display area.

9. The electroluminescent display substrate according to claim 5, wherein a material of the wall comprises a desiccant.

10. The electroluminescent display substrate according to claim 9, wherein the material of the wall further comprises a curable glue having a water content less than 200 ppm; the desiccant is mixed into the curable glue, and a weight percentage of the desiccant in the wall is 0.1%~1%.

11. The electroluminescent display substrate according to claim 5, wherein the wall has a width of 300~500 μm.

12. The electroluminescent display substrate according to claim 5, wherein materials of the first package layer and the second package layer are selected from at least one of $SiN_X$, SiON, and $Al_2O_3$; and the planarization layer comprises a resin material.

13. The electroluminescent display substrate according to claim 5, wherein the basal substrate is a flexible basal substrate.

14. A display apparatus, comprising the electroluminescent display substrate according to claim 5.

* * * * *